METHOD OF MAKING A SEMICONDUCTOR DEVICE
Filed Nov. 13, 1967
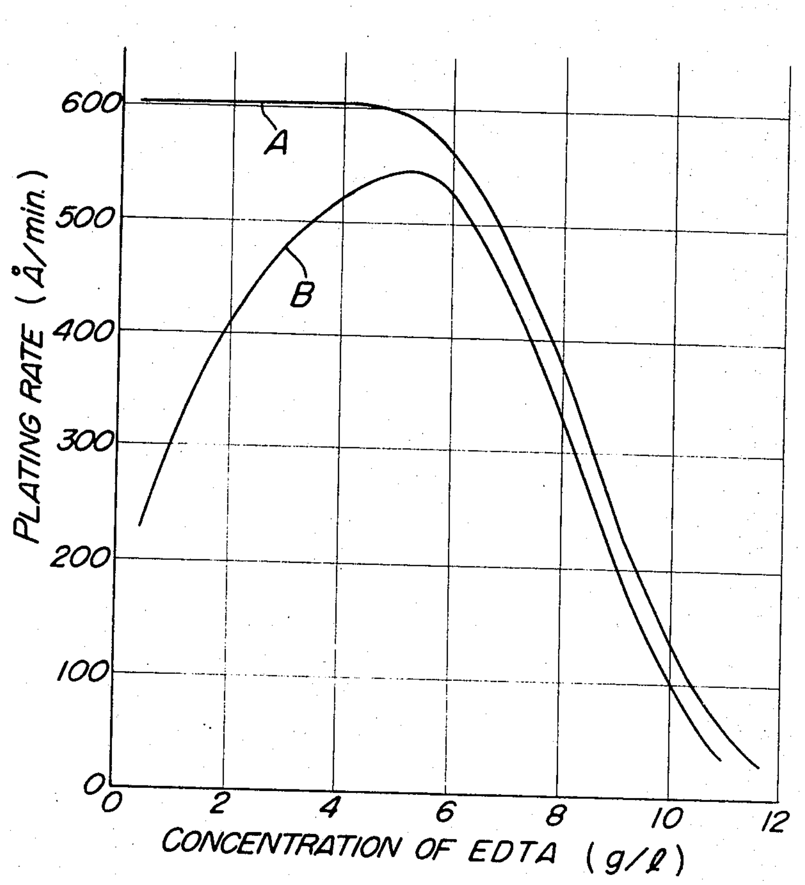
Inventors
Hitoo Iwasa
Masami Yokozawa
Hideo Tai
Iwao Teramoto United States Patent Office 3,531,320
Patented Sept. 29, 1970

3,531,320
METHOD OF MAKING A SEMICONDUCTOR DEVICE

Hitoo Iwasa, Toyonaka-shi, Masami Yokozawa, Takatsuki-shi, Hideo Tai, Toyonaka-shi, and Iwao Teramoto, Ibaragi-shi, Japan, assignors to Matsushita Electronics Corporation, Osaka, Japan, a corporation of Japan
Filed Nov. 13, 1967, Ser. No. 682,084
Claims priority, application Japan, Nov. 17, 1966, 41/76,004
Int. Cl. C23c *3/00*
U.S. Cl. 117—227 1 Claim

ABSTRACT OF THE DISCLOSURE

A small amount of ethylene diamine tetra acetic acid salt (EDTA salt) is added to a nickel plating bath including nickel salt, sodium hypophosphite and ammonium chloride as principal component when setting electrodes to a semiconductor device comprising P-N junctions so as to obviate the difference in the nickel plating rate between the surfaces of a P-type region and an N-type region. This method has the advantages that substantially no difference in the plating rate between the surfaces of a P-type region and an N-type region appears even if the plating is done on the surfaces of the P-type and N-type regions of a semiconductor device simultaneously and that the chemically stable properties of said plating bath can be preserved for a long period.

This invention relates to a method of making a semiconductor device and more particularly to a method of making a semiconductor device comprising P-N junctions and electrodes formed by plating nickel on a semiconductor surface according to an electroless nickel plating method.

As electroless nickel plating bath, two kinds of baths, i.e. acidic and alkaline, are generally known and an alkaline bath to which ammonia is added is widely used in case of a semiconductor substrate. For example, aqueous solution including 60 grams of nickel chloride $$(NiCl_2 \cdot 6H_2O)$$

130 grams of ammonium chloride ($NH_4Cl$) and 100 grams of ammonium citrate ($(NH_4)_2HC_6H_5O_7$) per liter is used as A liquid, and aqueous solution including 30 grams of sodium hypophosphite ($NaH_2PO_2 \cdot H_2O$) per liter is used as B liquid and 10 volumes of said A liquid and 20 volumes of said B liquid are mixed. A semiconductor sample is thrown into this mixture and said mixture is heated to about 95 C. Then, 5–15 volumes of aqueous ammonia of about 25% is added and the bath is maintained at the elevated temperature. Then, a plated nickel film is provided on the surface of said semiconductor sample. This method is already known.

There appears a great difference in the plating rate between the surfaces of a P-type region and an N-type region in a semiconductor sample comprising a P-N junction. In this case, the plating rate is generally smaller on the surface of a P-type region than on the surface of an N-type region and in an extreme case, the surface of the P-type region may not be plated at all. This is speculated to arise from the electrochemical reaction of plating, wherein a galvanic cell is formed due to the electromotive force of the P-N junction and the surfaces of the P-type region and the N-type region act as anode and cathode, respectively. Accordingly, the anodic reaction $$Ni^{++} + 2e \rightarrow Ni$$

is considered to become difficult to occur on the surface of the P-type region.

Further, in a conventional electroless nickel plating bath, nickel salt and a reducing agent like sodium hypophosphite react to precipitate metal nickel, nickel hypophosphite, nickel hydroxide or the like during preservation and the effective preservation period of the plating bath is limited to a short time. In order to prevent such precipitation in the plating bath, there has been employed a method wherein a reducing agent is prepared as different solution and the solution is mixed with other solutions just before plating. However, this method suffers from the disadvantage that the plating operation becomes complicated.

On the other hand, an object of this invention is to form a lustrous plating film on a surface of a semiconductor comprising a P-N junction by adding a small amount of ethylene diamine tetra acetic acid (this is referred to as EDTA salt hereafter) for obviating the difference in the plating rate on the surfaces of a P-type region and an N-type region of the semiconductor.

Other objects, features and advantages of this invention will become more apparent from the following detailed description of the invention when taken in conjunction with the accompanying drawing, which shows an example of the relation of the thickness of the plated film according to an embodiment of this invention.

As an example of the electroless nickel plating bath according to this invention, aqueous solution including 20 grams of nickel chloride ($NiCl_2 \cdot 6H_2O$), 35 grams of ammonium chloride ($NH_4Cl$), 40 grams of ammonium citrate ($(NH_4)_2HC_6H_5O_7$), 15 grams of sodium hypophosphite ($NaH_2PO_2 \cdot H_2O$) per liter and EDTA di-ammonium salt ($(NH_4)_2$ EDTA) may be used. After said plating bath is heated to 85–95° C., 20–50 volumes of 28% aqueous ammonia is added to 100 volumes of said plating bath. In this case, the temperature of the plating bath lowers temporarily, and so the bath is heated further. When the temperature of the plating bath becomes 85–95° C. again, a semiconductor sample comprising a P-N junction which is sufficiently cleaned in advance is dipped into said plating bath. If the plating operation is stopped after 10–60 seconds, plated nickel films having a substantially equal thickness are formed on the surfaces of the P-type region and the N-type region.

When nickel is plated on the surface of a silicon substrate comprising a P-N junction with the plating bath according to the invention having the composition described hereinabove while changing only the concentration of EDTA salt, the nickel plating rate on the surfaces of the P-type region and the N-type region varies as shown in the accompanying drawing. Namely, curve A shows the nickel plating rate on the surface of the N-type region. While the concentration of EDTA salt is increased to 5 grams per liter, the plating rate does not change, but the rate decreases when the concentration of EDTA salt is increased further. Curve B shows the plating rate on the surface of the P-type region. In this case, the rate increases gradually as the concentration of EDTA salt increases and it becomes maximum when the concentration of EDTA salt is about 5 grams per liter.

As is seen from said relation, when the concentration of EDTA is less than 5 grams per liter, the thickness of the plating film on the P-type region is smaller than that of the film on the N-type region and the difference becomes greater as the concentration is reduced. It was clarified by an experiment that no substantial difference in the thickness of the plated films between the surfaces of the P-type region and the N-type region appears when the concentration of EDTA salt is greater than 5 grams per liter and the thickness decreases with an equal rate as the concentration increases.

Further, since the plating rate can be increased by reducing the amount of ammonium citrate, the concentration of EDTA salt may be increased. However, if the amount of EDTA salt is too much, the plating rate becomes smaller. Therefore, the concentration of EDTA salt against the concentration of the nickel ions in the plating bath of 5–30 mol percent is preferable.

Instead of citrate salt in the plating bath described hereinabove, hydroxycarbonate salt like tartrate salt or malate salt can be used. It is also possible to use EDTA sodium salt, EDTA potassium salt, or a combination thereof as the EDTA salt instead of EDTA ammonium salt.

Since nickel hydroxide is soluble in EDTA solution, precipitation of nickel hydroxide during preservation can be prevented substantially and further caustic soda can be used instead of aqueous ammonia by adjusting the pH value if the concentration of EDTA salt is suitably selected.

Now, the embodiments of this invention will be described in detail hereinbelow.

EMBODIMENT 1

After a silicon substrate for a mesa-type transistor comprising contact windows at the oxide film on the surface of the substrate is cleaned, said substrate is preserved in iso-propyl alcohol. Aqueous solution of 100 cc. in amount including 20 grams of nickel chloride $$(NiCl_2 \cdot 6H_2O)$$

40 grams of ammonium citrate $((NH_4)_2HC_6H_5O_7)$, 35 grams of ammonium chloride $(NH_4Cl)$, 15 grams of sodium hypophosphite $(NaH_2PO_2)$ and 5 grams EDTA ammonium salt $((NH_4)_2 \cdot EDTA)$ per liter is heated to 90° C. and 28% aqueous ammonia of 20 cc. in amount is added to said heated solution. In this case, the temperature of the solution lowers temporarily, and the solution is heated further. When the temperature becomes 90° C. again, plating is performed by dipping said silicon substrate into said bath. After 30 minutes, lustrous plated nickel films of about 1000 A. in thickness are provided on the surfaces of the emitter, the base and the collector. Then, lead wires are connected to said plated nickel layers with solder. In this way, the assembly of the electrodes of a mesa-type transistor can be performed quite simply.

EMBODIMENT 2

The two surfaces of a silicon substrate are mechanically polished with No. 1000 abrasive powder and by diffusing phosphorus and boron from the respective surface, a PIN silicon diode is provided. Said PIN silicon diode is subjected to etching treatment in 5% caustic soda kept at 60° C. and cleaned with water and then with methanol. Aqueous solution of 100 cc. in amount including 25 grams of nickel chloride $(NiCl_2 \cdot 6H_2O)$, 35 grams of ammonium chloride $(NH_4Cl)$, 35 grams of ammonium citrate, 15 grams of sodium hypophosphite $(NaH_2PO_2 \cdot H_2O)$ and 10 grams of EDTA potassium $(K_2 \cdot EDTA)$ per liter is heated to 90° C. Then, 28% aqueous ammonia of 30 cc. in amount is added to said liquid and said silicon diode is thrown into said bath kept at 85° C. and dipped for one minute. As a result, lustrous plated nickel films having a substantially equal thickness are formed on both surfaces of said silicon diode. Then, the assembly of the diode is done by connecting lead wires to said plated nickel films with solder.

As has been described in detail hereinabove, it has become possible by the method according to this invention to form lustrous plated nickel films having a substantially equal thickness on the surfaces of a P-type region and an N-type region of a semiconductor comprising P-N junctions at the same time and thereby to simplify the manufacturing process of a semiconductor device greatly. Further, since the nickel ions are formed into nickel complex as well as pH is reduced due to the addition of EDTA salt into the plating bath in this invention, the plating bath can be preserved quite stably for a long period even if the reducing agent is mixed, and thus this invention is effective in simplifying the modification of the plating bath. Therefore, this invention has great industrial advantages.

What is claimed is:

1. A method of making a semiconductor device, wherein alkaline aqueous solution including carbonate salt and having nickel salt, sodium hypophosphite and ammonium chloride as principal component, to which at least one kind of ethylene diamine tetra acetic acid salt chosen from the group consisting of ethylene diamine tetra acetic acid ammonium salt, ethylene diamine tetra acetic acid potassium salt and ethylene diamine tetra acetic acid sodium salt is mixed, is held at a suitable temperature and electroless nickel plating on the surface of a semiconductor substrate having P-N junctions is carried out by dipping the semiconductor substrate into said solution, wherein a material selected from the group consisting of ethylene diamine tetra acetic acid salt chosen from the group consisting of ethylene diamine tetra acetic acid ammonium salt, ethylene diamine tetra acetic acid potassium salt and ethylene diamine tetra acetic acid sodium salt to be added to said solution has a molar concentration of 5–30% against the nickel salt.

References Cited

UNITED STATES PATENTS

| | | | |
|---|---|---|---|
| 2,819,187 | 1/1958 | Gutzeit et al. | 117—130 |
| 2,871,142 | 1/1959 | Hays | 117—130 XR |
| 2,995,473 | 8/1961 | Levi | 117—130 XR |

WILLIAM L. JARVIS, Primary Examiner

U.S. Cl. X.R.

106—1; 117—130